(12) United States Patent
Vick et al.

(10) Patent No.: US 8,361,901 B2
(45) Date of Patent: Jan. 29, 2013

(54) DIE BONDING UTILIZING A PATTERNED ADHESION LAYER

(75) Inventors: Erik P Vick, Raleigh, NC (US); Dean M. Malta, Cary, NC (US); Matthew R. Lueck, Raleigh, NC (US); Dorota Temple, Cary, NC (US)

(73) Assignee: Research Triangle Institute, Research Triangle Park, NC (US)

( * ) Notice: Subject to any disclaimer, the term of this patent is extended or adjusted under 35 U.S.C. 154(b) by 181 days.

(21) Appl. No.: 12/754,396

(22) Filed: Apr. 5, 2010

(65) Prior Publication Data

US 2010/0270685 A1  Oct. 28, 2010

Related U.S. Application Data

(60) Provisional application No. 61/166,378, filed on Apr. 3, 2009.

(51) Int. Cl.
*H01L 21/44* (2006.01)
(52) U.S. Cl. . 438/667; 438/455; 257/698; 257/E23.011; 257/E21.575
(58) Field of Classification Search .................. None
See application file for complete search history.

(56) References Cited

U.S. PATENT DOCUMENTS

| 7,271,491 | B1 * | 9/2007 | Akram | 257/774 |
| 2001/0005059 | A1 * | 6/2001 | Koyanagi et al. | 257/778 |
| 2004/0219706 | A1 * | 11/2004 | Wan | 438/53 |
| 2006/0278991 | A1 * | 12/2006 | Kwon et al. | 257/777 |

* cited by examiner

*Primary Examiner* — Ha Tran T Nguyen
*Assistant Examiner* — Shaka White
(74) *Attorney, Agent, or Firm* — Oblon, Spivak, McClelland, Maier & Neustadt, L.L.P.

(57) ABSTRACT

An electronic package and method and system for forming the electronic package. The electronic package has a first substrate including a first electronic device and including through-holes extending through an entire thickness of the first substrate. The electronic package has a second substrate bonded to the first substrate, metallizations formed in the through-holes of the first substrate to connect to components of the first electronic device, and a patternable substance disposed between the first substrate and the second substrate and adhering the first substrate and the second substrate together in regions apart from the metallizations. The method and system form through-holes extending through an entire thickness of the first substrate, deposit and pattern an adherable substance on the second substrate in a pattern having openings which expose connections for a second electronic device of the second substrate, align and attach the first substrate and the second substrate together, and form metallizations in the through-holes to connect to the connections for the second electronic device.

11 Claims, 10 Drawing Sheets

DIE BONDING UTILIZING A PATTERNED ADHESION LAYER

CROSS REFERENCE TO RELATED APPLICATIONS

This application claims priority under 35 U.S.C. §119(e) to U.S. Ser. No. 61/166,378 filed Apr. 3, 2009, the entire contents of which are incorporated by reference. This application is related to, entitled "A THREE DIMENSIONAL INTERCONNECT STRUCTURE AND METHOD THEREOF," U.S. Ser. No. 61/166,388, filed Apr. 3, 2009, the entire contents of which are incorporated herein by reference.

BACKGROUND OF THE INVENTION

1. Field of the Invention

The invention relates to a method involving patterned photoresist, or other adhesive material, for bonding substrates together.

2. Discussion of the Background

Conventional packaged microelectronic devices include a singulated microelectronic die, an interposer substrate or lead frame attached to the die, and a molded casing around the die. The die generally includes an integrated circuit and a plurality of bond-pads coupled to the integrated circuit. The bond-pads are typically coupled to terminals on the interposer substrate or lead frame, and supply voltage, signals, etc., are transmitted to and from the integrated circuit via the bond-pads. In addition to the terminals, the interposer substrate can also include ball-pads coupled to the terminals by conductive traces supported in a dielectric material. Solder balls can be attached to the ball-pads in one-to-one correspondence to define a "ball-grid array." Packaged microelectronic devices with ball-grid arrays are generally higher grade packages having lower profiles and higher pin counts than conventional packages using lead frames.

Packaged microelectronic devices such as those described above are used in cellphones, pagers, personal digital assistants, computers, and many other electronic products. To meet the demand for smaller electronic products, there is a continuing drive to increase the performance of packaged microelectronic devices, while at the same time reducing the height and the surface area or "footprint" of such devices on printed circuit boards. Reducing the size of high performance devices, however, is difficult because the sophisticated integrated circuitry requires more bond-pads, which results in larger ball-grid arrays and thus larger footprints. One technique for increasing the component density of microelectronic devices within a given footprint is to stack one device on top of another.

Formation of 3D metal interconnects on stacked IC chips has generally been accomplished using one of the two approaches: 1) Vias-First—interconnect formed before IC fabrication/thinning/bonding, or 2) Vias-Last—interconnect formed after IC fabrication/thinning/bonding The Vias-Last approach invariably requires some type of bottom clear etching of the via. FIG. 1 shows one example of a vias last approach using an un-patterned adhesive.

The difficulty of the bottom clear etch in step (3) depicted in FIG. 1 generally increases with the thickness of materials to be etched, and increases with the aspect ratio of the via. In many cases, bottom clear etches may also require an etch mask, contributing process complexity and integration issues.

The present invention addresses these and other difficulties in the Vias-Last approach while permitting via formation prior to bonding.

SUMMARY OF THE INVENTION

In one embodiment of the present invention, there is provided an electronic package having a first substrate including a first electronic device and including through-holes extending through an entire thickness of the first substrate. The electronic package has a second substrate bonded to the first substrate, metallizations formed in the through-holes of the first substrate to connect to components of the first electronic device, and a patternable substance disposed between the first substrate and the second substrate and adhering the first substrate and the second substrate together in regions apart from the metallizations.

In one embodiment of the present invention, there is provided a method which forms through-holes extending through an entire thickness of the first substrate, deposits and patterns an adherable substance on the second substrate in a pattern having openings which expose connections for a second electronic device of the second substrate, aligns and attaches the first substrate and the second substrate together, and forms metallizations in the through-holes to connect to the connections for the second electronic device.

In one embodiment of the present invention, there is provided a system for forming an electronic package. The system includes a wafer handler configured to handle a first substrate including through-holes and a second substrate. The system includes a through-hole formation unit configured to form the through-holes in a pattern that corresponds to connections to a second electronic device of the second substrate and a metallization unit configured to deposit the metallization into the through-holes to connect to components of the first electronic device. The system includes a wafer processor configured to 1) apply and pattern an adherable substance on the second substrate to produce a pattern in the adherable substance having openings which expose the connections to the second electronic device of the second substrate, 2) align the first and second substrates, and 3) attach the first substrate and the second substrate together.

It is to be understood that both the foregoing general description of the invention and the following detailed description are exemplary, but are not restrictive of the invention.

BRIEF DESCRIPTION OF THE DRAWINGS

A more complete appreciation of the present invention and many attendant advantages thereof will be readily obtained as the same becomes better understood by reference to the following detailed description when considered in connection with the accompanying drawings, wherein.

DETAILED DESCRIPTION OF THE INVENTION

Figure 2:
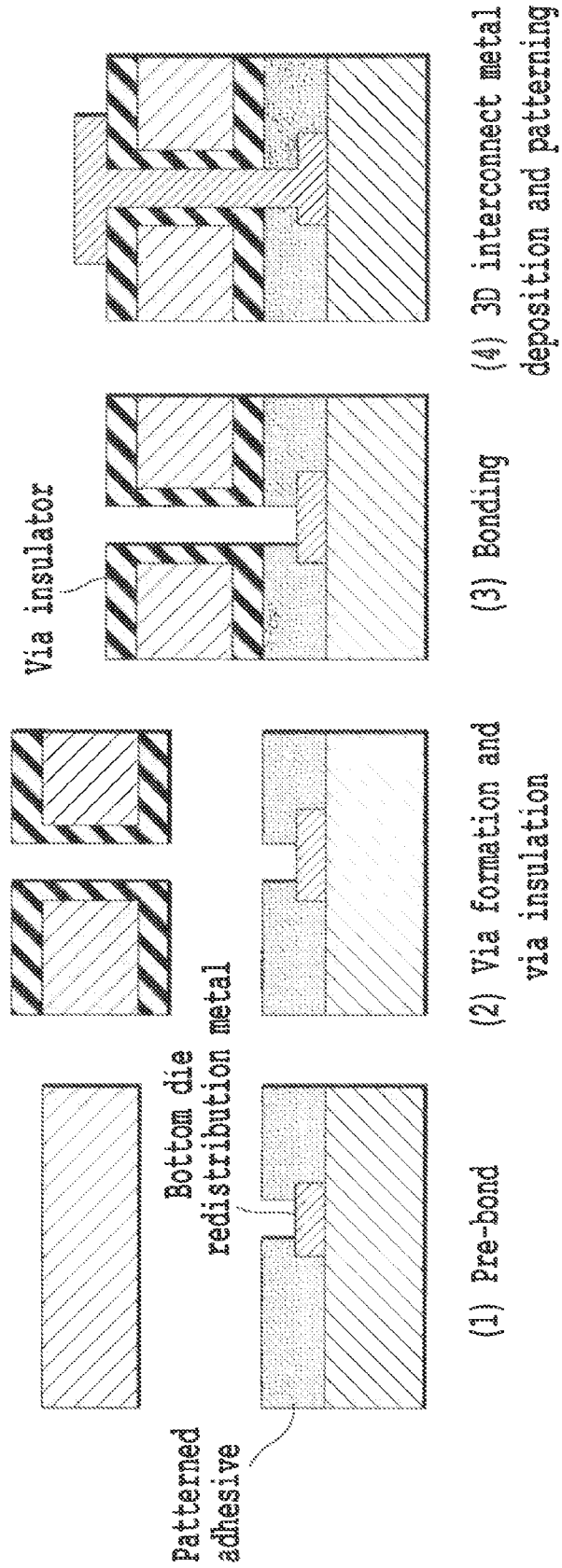
FIG. 2 is a depiction detailing the steps in one method of the invention for bonding a die set together.

Referring now to the drawings, wherein like reference numerals designate identical, or corresponding parts throughout the several views, FIG. 2 is a depiction illustrating a novel process of the present invention for die bonding for 3D interconnects using a photo-imagable adhesive layer.

The steps of the contact imprinting bonding process, according to one embodiment of the invention, are presented in FIG. 2. In an overview, these steps bond a top die to a bottom die using an approach where a photo-imagable adhesive layer is patterned prior to wafer or die bonding, thereby eliminating or reducing many of the bottom-clear problems noted above.

In this novel process, at step (1) in FIG. 2, a bottom die/wafer set is provided. The die wafer set has redistributed metal contacts on its top surface. The bottom die is coated with a patternable adhesive such as for example SU8™ to appropriate thickness—dependent on topography, and then the adhesive is soft baked. Details of the coating and developing processes are given below. Optionally, depending on the nature of the die sets being bonded, the patternable adhesive is planarized. Planarization can be an important step since the cross-linked adhesive (i.e., exposed/baked adhesive) has a very high viscosity, and bonding is generally performed below a glass transition temperature of the adhesive. The adhesive can be deposited and patterned using traditional photolithography techniques—coat, expose, post-exposure bake, and develop—to provide openings to the contact on the top surface of the bottom die.

A conventional resist coating apparatus, such as a spin coater, or a meniscus coater, can be used to deposit a film of the adhesive to a desired thickness onto a substrate. The deposited film can then be "prebaked" for example at approximately 95° C. for about 3 minutes, for example. The prebaking step drives solvents from the deposited film in order to partially harden the film for subsequent processes. Following prebaking, the thick film resist can be exposed in a desired pattern by directing exposure energy through a reticle. Exposure of the photo-imageable adhesive can be accomplished with conventional photolithography equipment which provides an appropriate wavelength and dose for the adhesive. A representative UV dose for the previously described resist formulation is about 200 mJ/cm$^2$.

Following exposure, the deposited film resist can be developed to form a pattern of openings. One suitable wet chemical for developing the above resist formulation is a solution of PGMEA (propyleneglycol-monomethylether-acetate). Another suitable wet chemical is a hot (e.g., 105° C.) solution of n-methyl-2-pyrrolidone.

In addition to SU8™, other suitable photo-imageable adhesives for the invention include polymide/epoxy/BCB. One suitable SU8™ resist for the invention is a negative tone, thick film resist sold by Shell Chemical under the trademark EPON RESIN SU8™. This thick film resist includes an epoxy resin, an organic solvent (e.g., gamma-butyloracton), and a photoinitiator. The thick film resist can be deposited to over a thickness range of 1-50 mils. In addition, the thick film resist can be developed (i.e., etched) with high aspect ratio openings having almost vertical sidewalls.

At step (2) in FIG. 2, a top die/wafer set is provided. Almost any substrate material can be accommodated in the invention. Via-holes are formed in the top die/wafer set. Almost any process can be accommodated to make the via-holes (e.g., DRIE, laser drill, etc.). Optionally, the via-hole can be passivated by deposition of a conformal insulating coating in one example. Almost any material can be selected, with the main considerations being conformality and predetermined, or target, thickness. The top die/wafer set is aligned with the bottom die/wafer set, then brought into contact with bottom die/wafer set. For some via insulator materials, an oxide is applied to the topside of the top die to prevent the via insulator from sticking to the bonder. An EVG mask aligner, or Karl Suss bonder, can be used for the alignment.

At step (3) in HG. 2, the two die/wafer sets are bonded. The bonding typically involves heating the two die/wafer sets (which are in contact) to a temperature exceeding the glass transition temperature of the cross-linked adhesive. These temperatures are known for most any type of patternable adhesive which may be selected. The adhesive post-exposure bake typically determines the percentage of cross-linking, so bonding conditions will depend on the post-exposure bake process.

Any gap remaining between the bonded die/wafer sets can be filled with a dielectric, which in one embodiment is a conformal dielectric in order to compensate for any gaps in the bond line. A deep reactive ion etch (DRIE) is used to clear the gap-fill dielectric from the bottom of the via. Gap-fill dielectric deposition/DRIE can be eliminated if the bonding is optimized for a gap-free bond, or if gap density is very small compared to interconnect density.

In one embodiment of the invention, a plasma treatment as described in the above-noted application "A THREE DIMENSIONAL INTERCONNECT STRUCTURE AND METHOD THEREOF" is utilized to clean metal pads existing on the bottom wafer prior to via metallization. For example, for a low contact resistance in the case of a MOCVD Cu interconnect to tungsten, a 30 sec Ar sputter etch treatment or a 30 sec SF$_6$ etch treatment can be used. While the times given here are not restrictive, the times are set so as not to cause damage to the pad and not remove an excessive amount of the contact pad material. In one example, an inductively coupled plasma (ICP) etcher was used such as for example an ICP Multiplex ASE (Advanced Silicon Etcher) by Surface Technology Systems (STS) with standard rate ICP source. The specific equipment used had a 1 kW RF power source (13.56 MHz) for the coil and a 300 W RF power source (13.56 MHz) for the platen, which are controlled independently of each other. STS ICP system combines a high conductance, high vacuum compatible process chamber with an ICP source to produce a very high ion density at low pressures. Other plasma etchers could be used in the invention, although etch times and recipes would most likely have to be adjusted somewhat from those described below.

Ar Sputter Etch
Pressure 5 mTorr,
Ar flow rate 40 sccm,
Power 500 W coil, 300 W platen
Substrate holder unheated
SF$_6$ etch:
Pressure 26 mTorr,
SF$_6$ flow rate 130 sccm,
Power 600 W coil, 24 W platen
Substrate holder unheated While not bound to a particular theory, the argon and $SF_6$ etch techniques are believed to remove oxidation, residue, and undesired layers from the tungsten contact pad prior to via metal fill. Other suitable chemistries for "cleaning" the tungsten contact pad surface include wet chemistries such as hydrogen peroxide (wet chemical) and/or $CF_4$ and $O_2$ mixtures (plasma). These treatments may need an additional treatment with the above described Ar sputter etch for an abbreviated period of time to remove any nascent tungsten oxide.

In the case of contact pads other than tungsten, the following reactants for the given metal is suitable in various embodiments of the present invention. For aluminum contact pads, a plasma $SiCl_4$ gas could be used. Other agents for aluminum cleaning can include for example $Cl_2$, $BCl_3$, and others, which are used in traditional RIE of Al films. For tungsten silicide contact pads, a plasma $NF_3$ gas could be used. For nickel silicide contact pads, a plasma $NH_3/NF_3$ gas could be used. When the surface is an exposed W contact pad, the contact pad could be plasma treated for example with an Ar or a $SF_6$ plasma, as described above in detail. When the surface is an exposed Al contact pad, the contact pad would be plasma treated for example with $SiCl_4$ gas. When the surface is an exposed tungsten silicide contact pad, the contact pad could be plasma treated for example with $NF_3$ gas.

At step (4), an interconnect metal is deposited in the via holes, and the interconnect metal on the top die/wafer set can be patterned if needed.

Exemplary Conditions for SU8 Processing:
1) $1^{st}$ Coat SU8 2010
   30 sec @ 3000 rpm spin-out/dynamic dispense (POUR)
   Soft Bake: 60 sec @ 95° C. proximity (2 step)/2 min @ 95° C. contact.
2) $2^{nd}$ Coat SU8 2010
   30 sec @ 3000 rpm spin-out/dynamic dispense (POUR)
   Soft Bake: 60 sec @ 95° C. proximity (2 step)/2 min @ 95° C. contact.
3) FC150 Mechanical Planarization (details provided below).
4) Expose—15 sec/I-line/soft contact.
5) Post Exposure Bake (PEB)—20 sec @ 65° C. contact.
6) Develop
   3 min SU8 developer
   30 sec IPA rinse.
7) FC 150 Top Die Bonding
   3000 Å/180° C. PECVD oxide deposited at on top die to prevent sticking
   Bond—5 kg @ 250° C.
8) Parylene Gap Fill (3 μm).
9) SU8 2010 Edge Fill
   Apply SU8 2010 to edge of die to underfill gaps
   Cure SU8—1 hr @ 200° C. (flat).
Surface Planarization:

As noted above, in one embodiment of the present invention, planarization is performed to facilitate wafer bonding. Accordingly, the following exemplary process can be used, as illustrated below with reference to FIG. 3.

Figure 3:
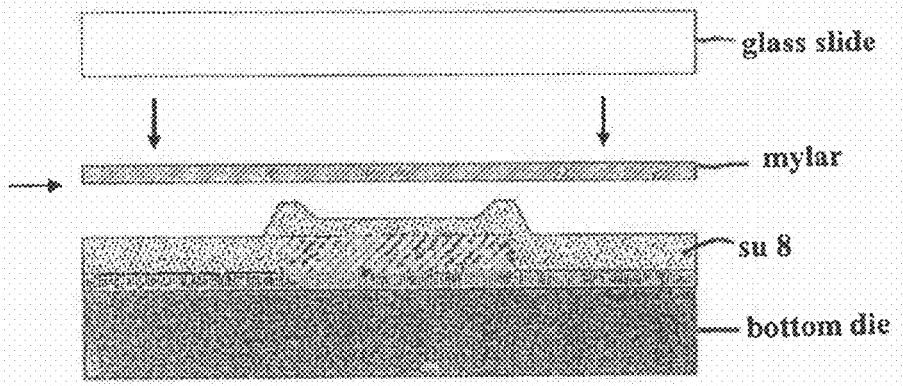
FIG. 3 is a depiction detailing planarization steps in one method of the invention.
Figure 3:
Figure 3:
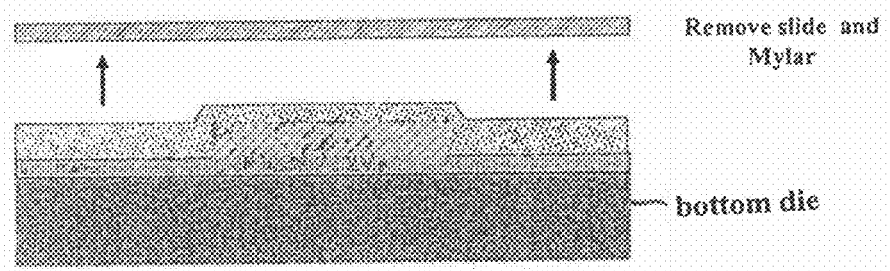
Figure 3:
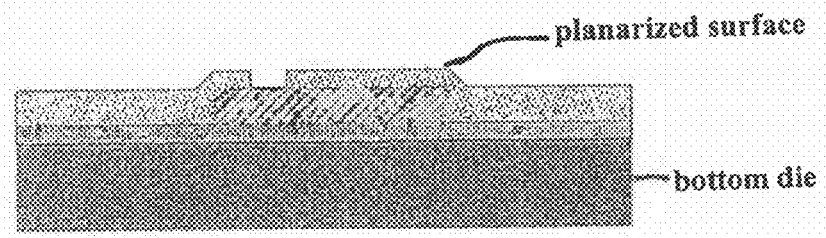

As seen from FIG. 3, a double coat of SU8™ is spun onto the bottom die. Using a Karl Suss FC 150 bonder, for example, a glass slide is pressed by way of a Mylar covered substrate onto the double coat of SU8™. This process mechanically planarizes the SU8 coat. A pressure of 2 kg, at a temperature of 75° C., has been shown to be the successful. The glass slide and Mylar are subsequently removed. At this point, the planarized pattenable adhesive on the bottom bottom die/wafer set is ready for the processing in FIG. 2.

Other release layers suitable for planarization include water-soluble PVA and PECVD oxide (which can be coated directly onto the glass slide), and polytetrafluorethane.

Planarization results are dependent on the planarity of the Mylar and the glass slide. For most applications, the non-planarity imparted by the Mylar and glass is insignificant. Since the glass transition temperature of the unexposed planarized SU8™ is <60° C., a short 60° C. hotplate bake following planarization has been shown to eliminate small defects by re-flow of the SU8™.

Figure 4:
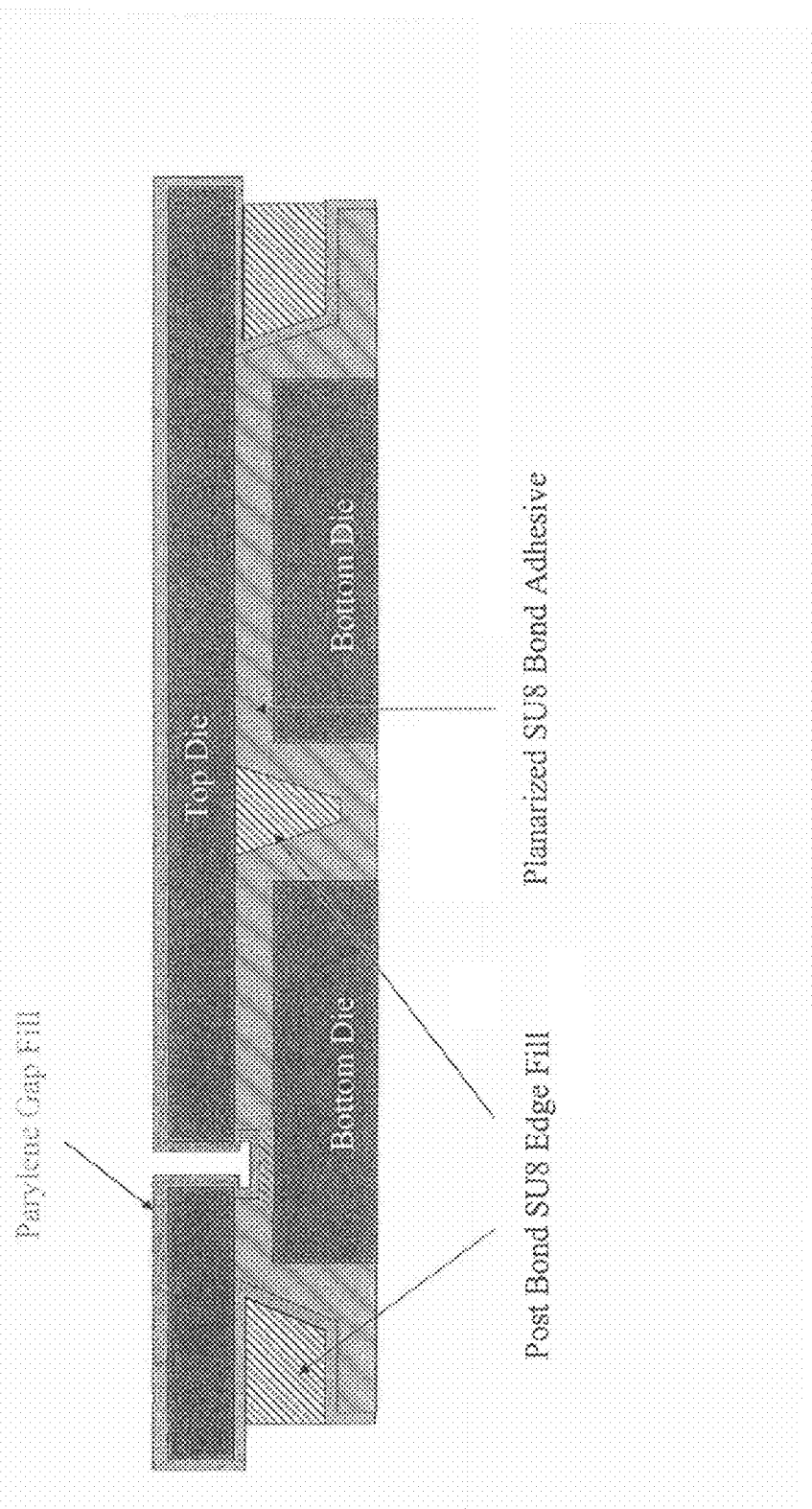
FIG. 4 is a depiction detailing a gap fill process in one method of the invention.

Bonding Results:

FIG. 4 shows a schematic of a bonded die pair, formed using the previously described processes. The top die via is aligned to the via formed in the SU8 bonding adhesive (SU8 patterned pre-bond). FIG. 4 shows a thin, conformal parylene gap fill layer which effectively coats the entire bonded die pair. As previously described, this layer can effectively fill exposed gaps in the bond-line. However, if the bond is optimized such that the number (and/or size) of the gaps is sufficiently low compared to the interconnect density (or size), the gap fill could be eliminated. In this case, the 3D interconnect could be completed with no required DRIE etching of the bonded pair—no bottom-clear DRIE. Since DRIE etching of materials in high aspect ratio vias can be extremely complicated, this manifestation of the SU8™ patterned bond is particularly significant.

FIG. 4 also shows a post-bond SU8 edge fill layer. This layer is another option, which was required for the die stack shown. The die stack shown in the schematic involves a top die which is larger than the bottom die. It was empirically found that the large gaps between the die resulted in mechanical instability which could lead to edge chipping and breakage in subsequent processing/handling. Consequently, the large gaps can be effectively filled by application of SU8™ to the bonded pair. Liquid SU8™ is applied to the edges of the die pair, after which capilary action will pull the SU8™ into gaps. The SU8™ is then cured, forming a mechanically (and chemically) stable bond.

Figure 5:
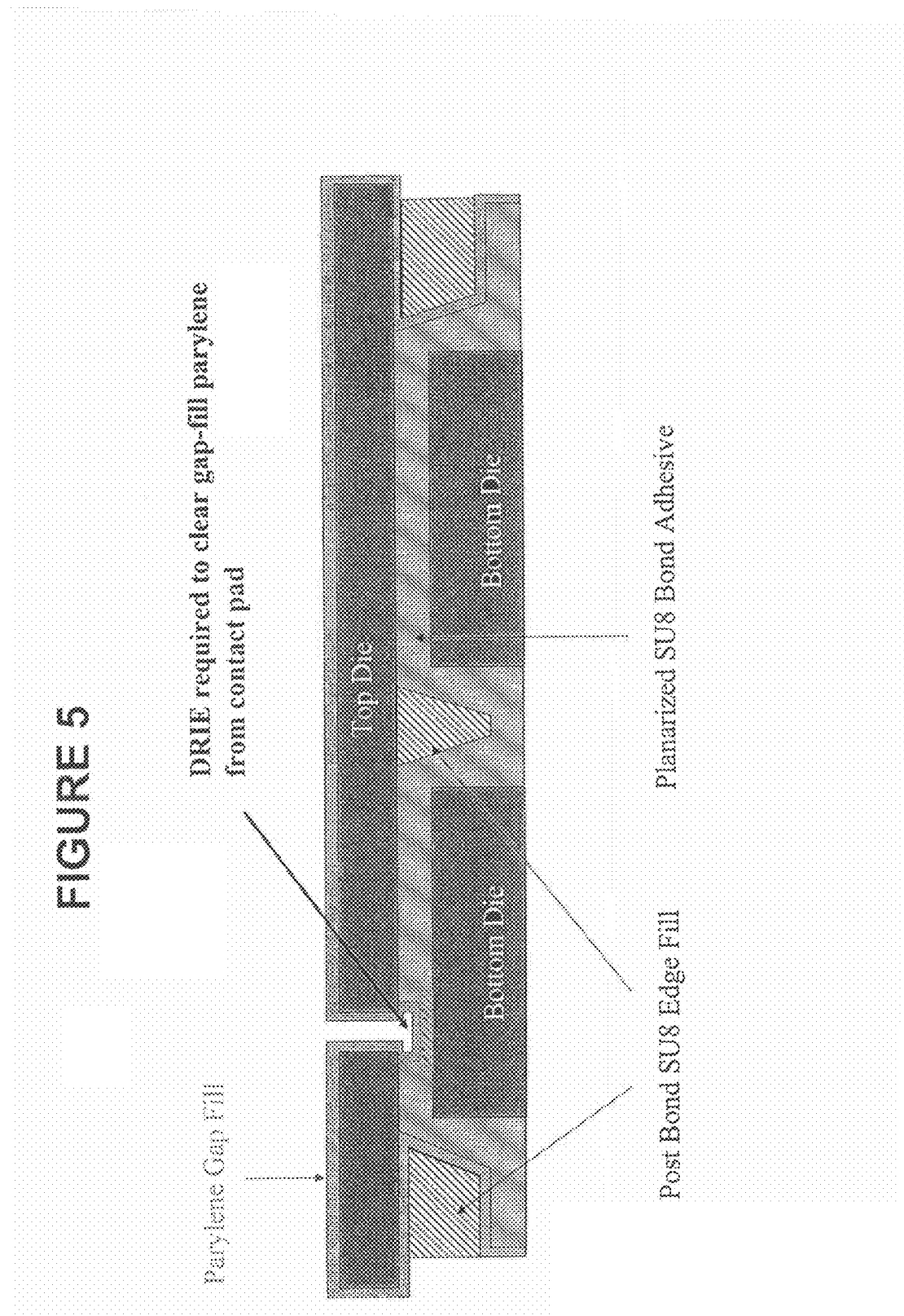
FIG. 5 is a depiction detailing a gap fill clearing (bottom-clear DRIE) process in one method of the invention.

FIG. 5 shows a similar schematic as FIG. 4, except the parylene gap fill layer covering the 3D via metal contact pad is highlighted. The metal contact pad is electrically connected to the appropriate circuitry, as determined by the circuit design, of the bottom die. In order to create an electrical interconnect between the contact pad (bottom die) and the top die, a low-resistance contact must be made between the via fill metallization and the contact pad. Since the parylene gap fill is a dielectric, this layer must be effectively and selectively removed from the top of the metal contact. Typically, a DRIE etch is required to remove the parylene from the contact pad at the bottom of the 3D via. This etch is often referred to as a DRIE bottom-clear etch. As previously discussed, this type of DRIE etch is not trivial to develop, or implement. For the bonded pair architecture shown in FIG. 5, a successful DRIE bottom-clear etch of the parylene film was demonstrated.

Figure 6:
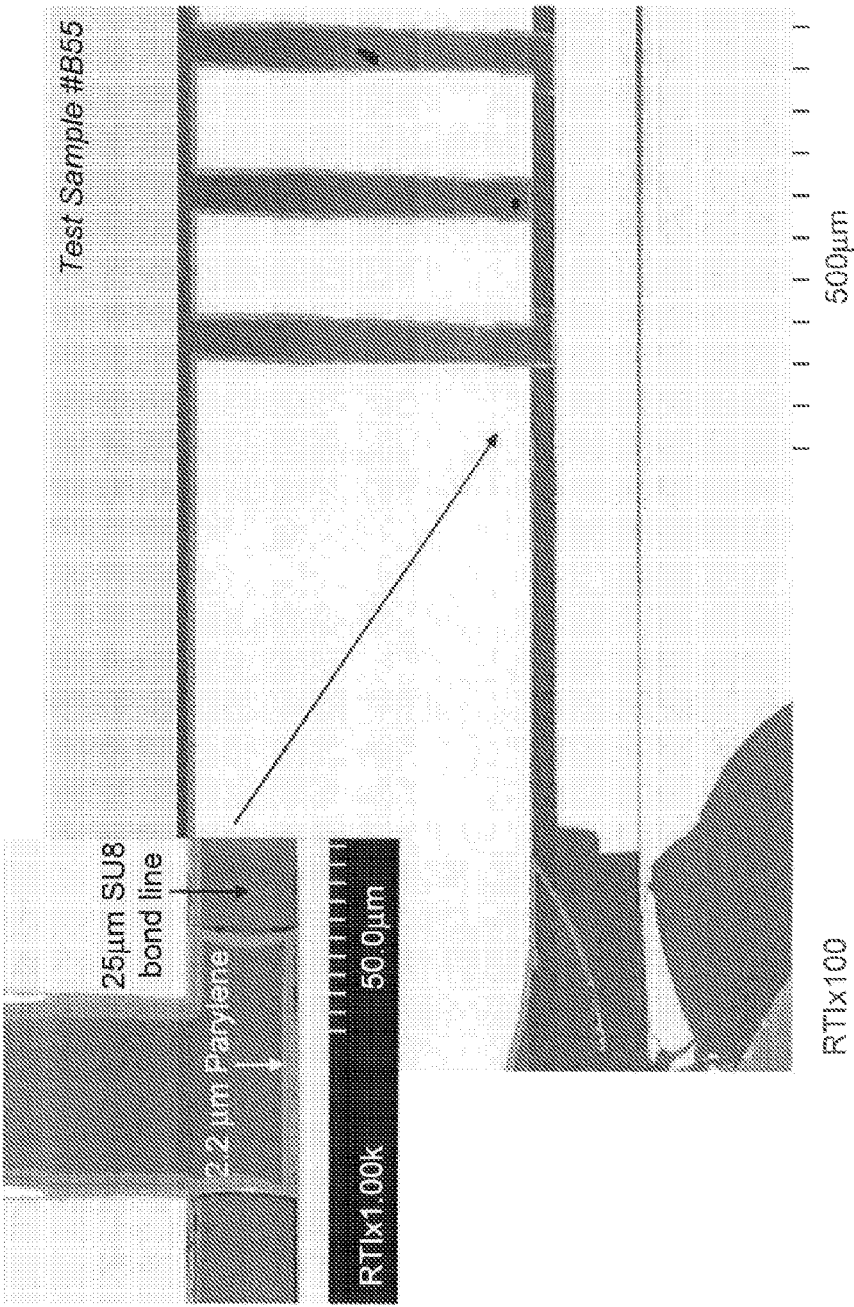
FIG. 6 is a micrograph showing a bonded wafer set of the invention.

FIG. 6 shows a cross-sectional scanning electron microscope (SEM) micrograph of an actual die pair bonded using the SU8™ patterned bonding process. The parylene gap fill and SU8™ bond line are indicated in FIG. 6. From FIG. 6, it can be observed that the diameter of the SU8™ via patterned on the lower die can be larger (or smaller) than the 3D interconnect via (deep via pre-formed in the top die). This feature of the patterned adhesive bonding was not significant for the application demonstrated, but could be an enabling technology for other applications.

The die which form the bonded pair shown in FIG. 6 are thin Si test samples, not electrically active die. Consequently, a contact pad was not formed on the bottom die.

Figure 7:
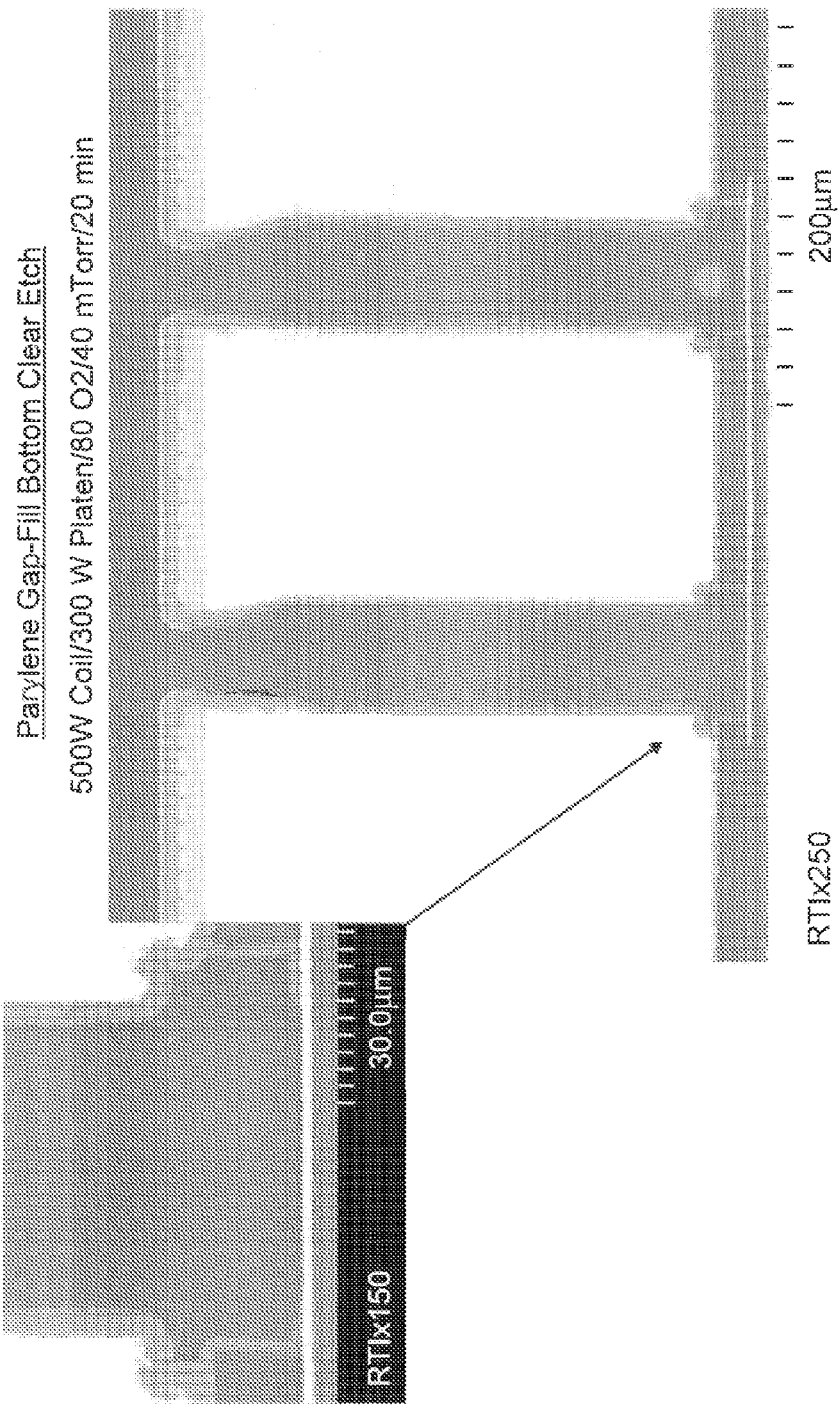
FIG. 7 is another micrograph showing a bonded wafer set of the invention.

FIG. 7 shows the successful bonding of electrically active die using the patterned SU8 bonding procedure. The 3D vias are aligned to the metal contact pads which were fabricated on the lower die prior to bonding. In the case shown in FIG. 7, the contact pad routes the electrical signal between the two 3D vias, forming a contact chain for test purposes. While not shown, the contact pad can route the via metal to the bottom chip circuit, which is the case for 3D vias in other areas of the die.

Most significantly, the bonded die shown in FIG. 7 are heterogenous, and the 3D via was formed prior to bonding. In fact, the 3D via was formed using a propriety combination of DRIE and laser drilling. Most traditional 3D interconnect approaches would not permit such an exotic 3D via formation technique. Thus, one of the features of the patterned bonding approach includes—(1) the ability to form the 3D via prior to bonding, and (2) the elimination (or minimization) of subsequent DRIE bottom clear etches, which could be severly impacted by the aspect ratio created by the via formation. From FIG. 7, it can be seen that the sidewall slope of the 3D via is highly discontinuous—negative (re-entrant) slope near the top, giving way to a straighter slope through the middle, and finally a sever undercut at the bottom. This highly discontinuous slope severely impacts the ability to perform subsequent DRIE bottom clear etches. A thick bond layer, which would likely be present with any traditional die bonding approach, would represent a significant challenge. Even if a thick bond layer could be successfully cleared, it would certainly involve added process complexity, and/or device design/performance trade-offs.

Figure 1:
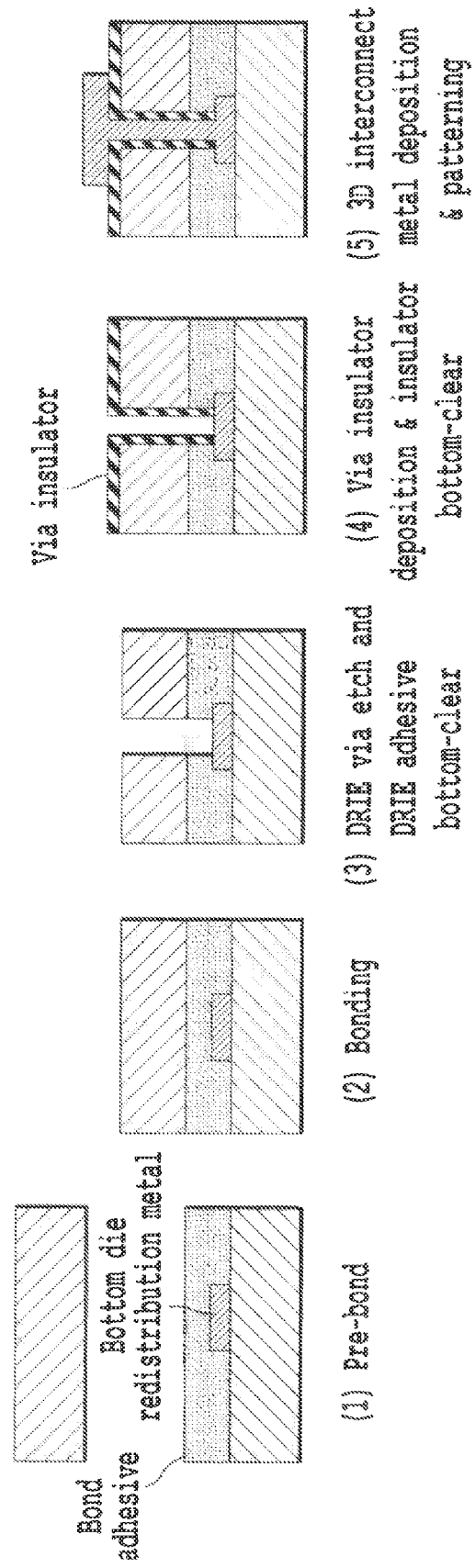
FIG. 1 is a depiction detailing a vias last approach for bonding a die set together.

In addition to independent formation of the 3D via, passivation of the via is independent from the chip stack integration. For most vias-last 3D interconnect approaches (FIG. 1), thicker via passivation layers result in thicker layers which must be etched from the bottom of high aspect ratio vias. The inset in FIG. 7 shows the result of an effective parylene bottom clear etch—parylene gap fill removed over the contact pad. Since a thick via insulation dielectric could be applied after 3D via formation, yet prior to bonding, only a thin parylene gap fill dielectric was deposited on the contact metal. By minimizing the dielectric thickness, the DRIE bottom clear was successful. Conformal via metallization could now be applied to electrically connect the contact pad of the lower die to the circuitry of the top die.

Accordingly, the patternable adhesive bonding process of the present invention offers:
1) Greater flexibility in via formation and via insulation by de-coupling these processes from the post-bond process.
2) A simpler bonding process avoiding a greater level of optimization.
3) No bottom-clear of the bond adhesive, therefore integration of much thicker bond lines is made possible.
4) A flexible process suitable for other photoimageable adhesives.

Whereas continuous adhesion layers require subsequent etches to clear the adhesive from the underlying substrate, the photo-patterned SU8™ adhesion layer of the present invention eliminates the absolute necessity for an adhesive etch step required for vertical interconnect formation. Typically, an adhesive etch process is a difficult etch step which requires advanced etch equipment and extensive process control, and results are critical to final 3D interconnect performance. Also, complicated process integration schemes are typically required to successfully integrate the adhesive clear etch into the process. The SU8™ patterned bond used in one embodiment of the invention completely eliminates the adhesive etch. Equally significant, the patterned SU8™ bond process also facilitates the bonding of die with preexisting vias (holes).

At the required bonding force and temperature, the viscosity of most die bond adhesives is low enough to result in at least partial re-filling of the vias with bond adhesive. Any refilling of the vias significantly complicates subsequent 3D interconnect processing. However, the patterned SU8™ bond has shown minimal impact on the pre-existing vias.

Figure 8:
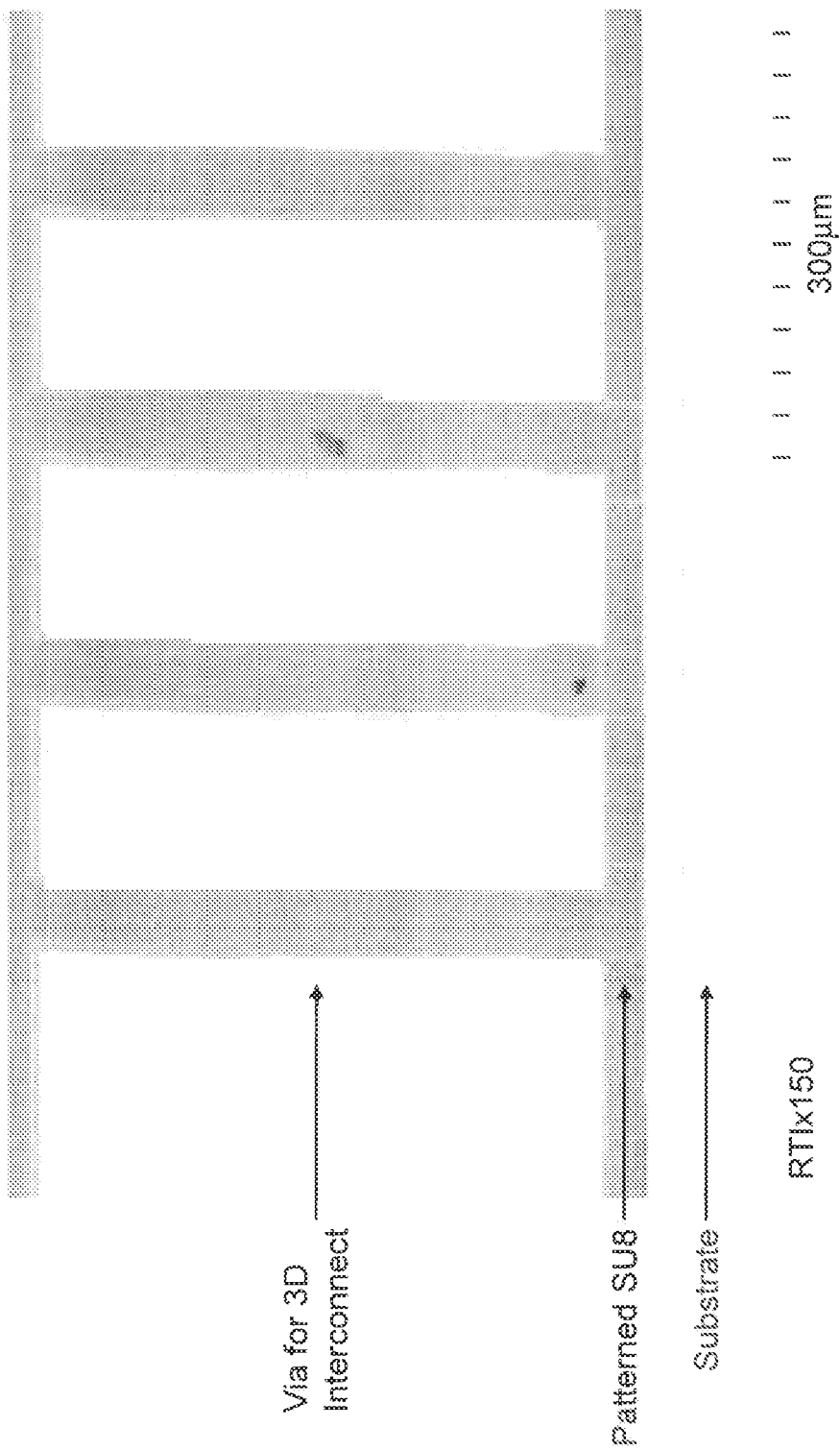
FIG. 8 is another micrograph showing a bonded wafer set of the invention with the parylene gap-fill bottom clear.

FIG. 8 shows the capability of the invention to form abrupt side-walls in a patternable adhesive layer, such as SU8™, and successfully bond a top die with pre-existing 3D vias. From FIG. 8, it can be seen that the high viscosity of the patterned adhesive prevents the adhesive from re-flowing into the via hole regions during the bonding process. A slight offset of the patterned SU8 via and the 3D via can be observed. This is an unintended consequence of the alignment tolerance of the tool used to performed the aligned bonding process. Small misalignments in bond alignment will not prevent successful fabrication of 3D interconnects. Mechanically, this has been demonstrated.

Accordingly, the invention can be utilized for die to wafer bonding, with or without pre-existing vias, for 3D interconnect applications. The invention can be also utilized for die to die bonding, pre-existing vias, for 3D interconnect applications. In these applications utilization of SU8™ as an adhesive presents some practical limits on the bonding process as the glass transition temperature of SU8™ is above 200° C., thereby typically requiring bonding temperatures above 200° C. Other adhesives or bonding agents could permit bonding at the bonding temperatures of those materials which could be higher or lower than 200° C.

The process for planarization and patterned SU8™ bonding has been demonstrated on SiGe die to GaAs die, Si test die (top and bottom), and glass test die to Si test die. However, the invention would be applicable to any applications where a combination of the following factors exist:
(1) homogenenous/hetergenenous chip stacking technologies,
(2) homogenenous/hetergenenous die on wafer technologies, and/or
(3) three-dimensional metal interconnects.

Bonding may be possible at lower temperatures using higher force, and/or if the bonding areas are extremely flat. As noted above, other patternable adhesives can be used. Up to 250° C., the viscosity of the SU8™ is high. Consequently, if a bond with no gaps is desired, die and substrate topography is minimized since the SU8™ will not flow into gaps created by high topography. In order to minimize gaps in the bond line, a mechanical planarization technique, shown in FIG. 3, has been developed and demonstrated.

Indeed, planarization of SU8™ on 2.5 mm×4 mm die bonded to 100 mm Si wafers has been demonstrated and replicated. The planarized SU8™ was subsequently patterned and used to successfully bond Si test die, and electrically active SiGe top die. Results of the bond suggest excellent planarity within die, and from die to die.

The process for planarization and patterned SU8™ bonding has been demonstrated on SiGe die to GaAs die, Si test die (top and bottom), and glass test die to Si test die. However, the invention would be applicable to any application needing local/global planarization for fabrication of nanoscale technologies (IC, MEMS, etc.), including (but not limited to):
(1) planarization for chip stacking technologies (die-die or die-wafer), and/or
(2) planarization for 2 and 3 dimensional metal interconnects.

Figure 9:
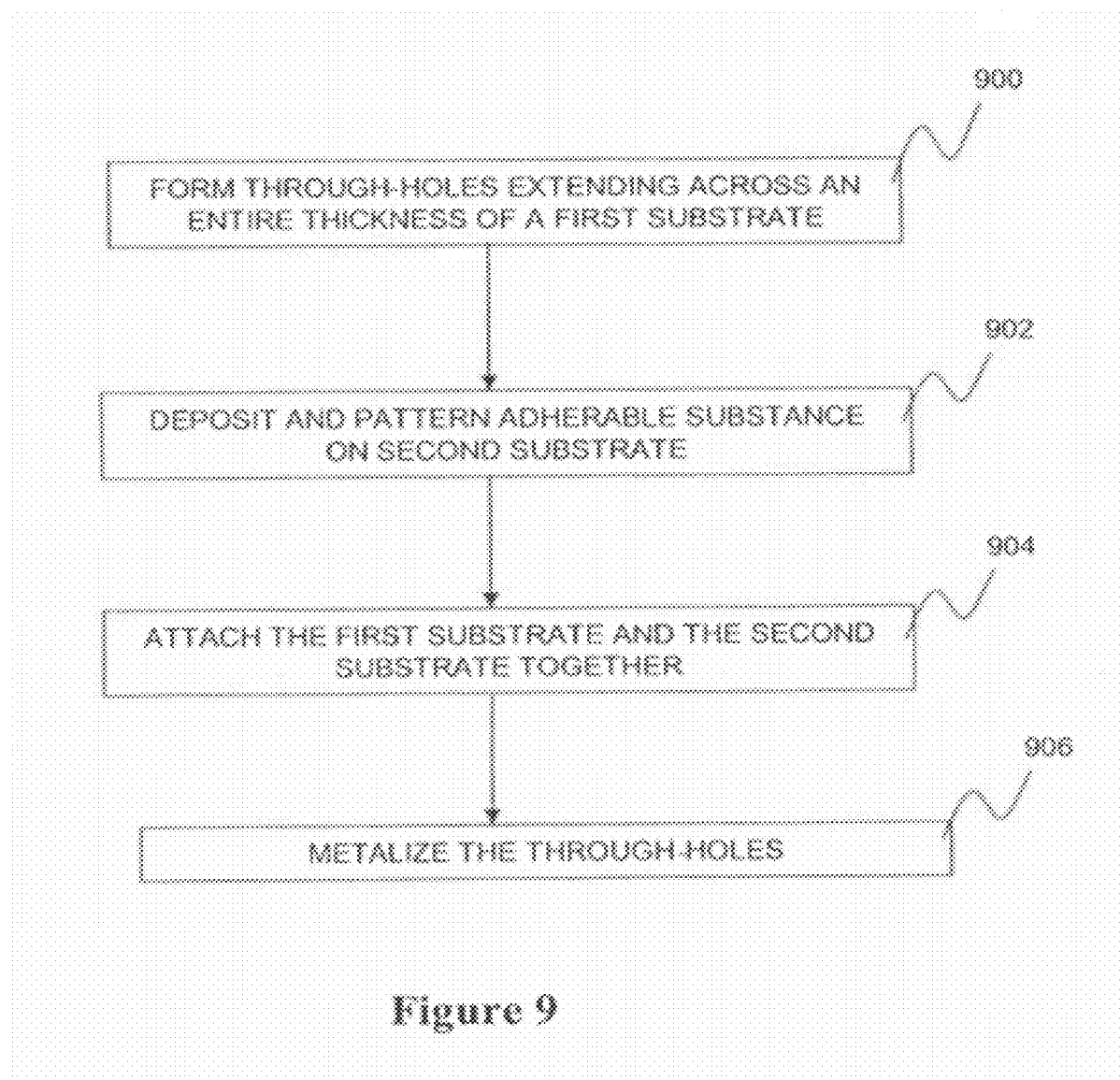
FIG. 9 is a generalized flowchart showing a process according to one embodiment of the present invention.

Processes and Systems:

FIG. 9 is a generalized flowchart showing a process according to one embodiment of the present invention. At 900, through-holes are formed which extend across an entire thickness of a first substrate. The through-holes are provided for subsequent connections of a first electronic device to a second electronic device by way of a metallization in the through-holes. At 902, an adherable substance is deposited and patterned on the second substrate in a pattern which exposes connections to a second electronic device of the second substrate. At 904, the first substrate and the second substrate are aligned and attached together. At 906, metallizations are formed in the through-holes. The metallizations connect to connections for the second electronic device.

At 900, the through-holes in the first substrate can be aligned with the connections to the second electronic devices of the second substrate. At 900, the through-holes can be formed in a pattern corresponding to the connections for the second electronic devices of the second substrate. The pattern can be formed by lithographic patterning and deep ion etching the pattern or formed by laser drilling the pattern. At 904, the first substrate and the second substrate can be adhered together with at least one of an adhesive, an eutectic metal, or a silica based glass. At 904, the adherable substance can be planarized prior to attaching the first substrate and the second substrate together.

At 904, the first substrate and the second substrate can be adhered together with a patternable adhesive, and the patternable adhesive can be planarized prior to attaching the first substrate, the interconnecting member, and the second substrate together.

At 900, the through-holes can be formed from a thinned glass or semiconductor substrate. After forming the through-holes, an insulating film can be formed on the walls of the through-holes to insulate a body of the first substrate from the via metallizations.

Figure 10:
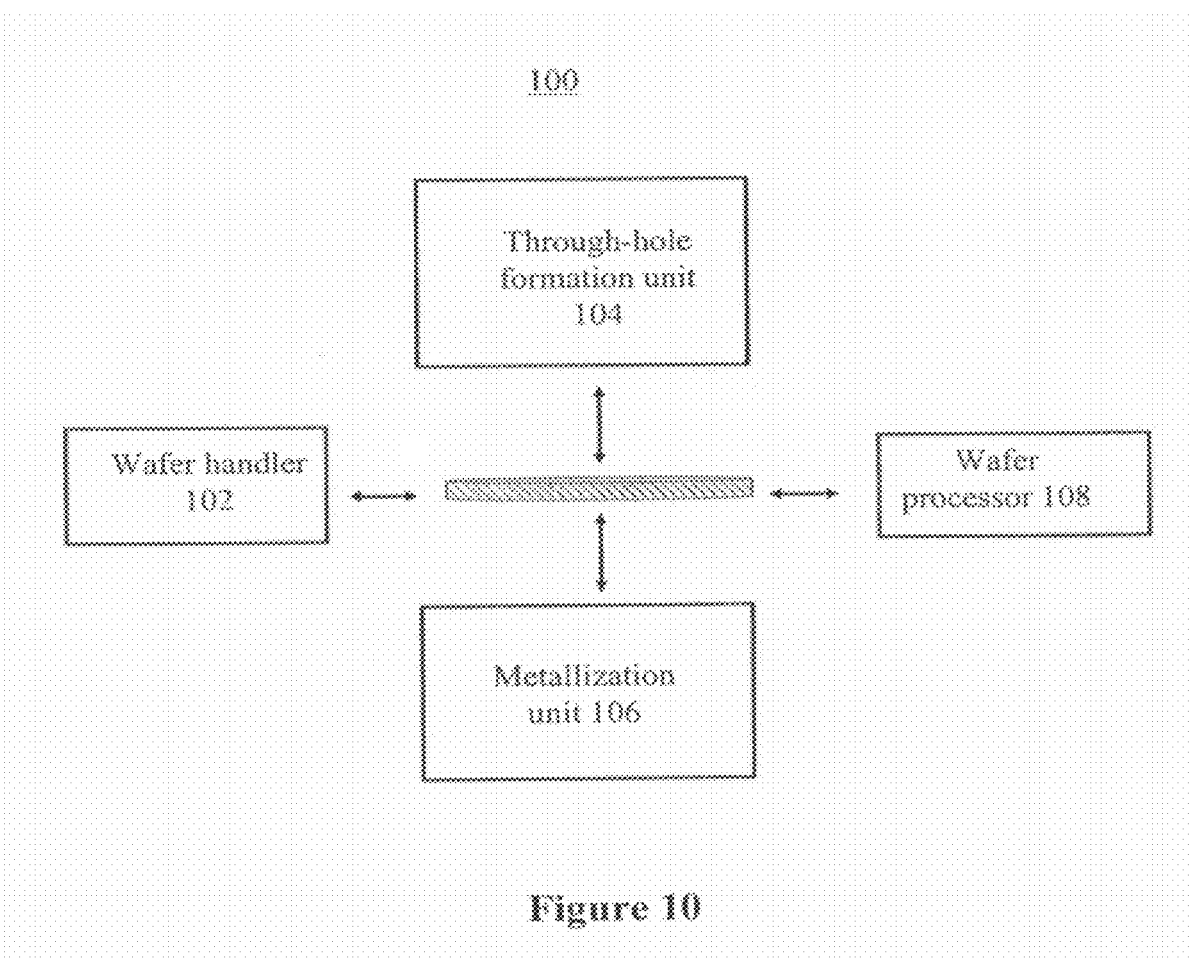
FIG. 10 is a schematic depicting the elements of a system for forming a via interconnect.

FIG. 10 is a schematic depicting the elements of a system for completing the fabrication of the via interconnect configurations shown above. The system 100 shown in FIG. 10 is for illustration purposes of various embodiments of the invention. The system in FIG. 10 includes a wafer handler 102 configured to handle a first substrate including a first electronic device and a second substrate including a second electronic device. The system includes a through-hole formation unit 104 configured to form through-holes in the first substrate in a pattern that corresponds to connections to one or both of the first and second electronic devices. The system includes a metallization unit 106 configured to deposit a via-fill metal into the through-holes. The system includes wafer processor 102 is configured to 1) apply and pattern an adherable substance on the second substrate to produce a pattern in the adherable substance having openings which expose the connections to the second electronic device of the second substrate, 2) align the first and second substrates, and 3) attach the first substrate and the second substrate together.

The attachment can occur by way of a pressure/temperature bonder, although other wafer and die bonding equipment can be used. Pressure/temperature bonders and techniques for wafer preparation and handling suitable for the invention are described in U.S. Pat. Appl. Publ. No. 2006/0292823, the entire contents of which are incorporated herein by reference. One suitable bonder is the Suss MicroTec FC-150 device bonder.

The system in FIG. 10 can include for through-hole formation unit 104 a photographic mask layout wafer processor and a deep reactive ion etcher. The wafer processor can include for example a UV exposure and developer forming a patterned photoresist mask on the upper substrate for patterning. One suitable exposure tool is the Suss MA-8 mask aligner. The through-hole formation unit 104 can be a laser drilling system.

The system in FIG. 10 can include for the metallization unit a Cu electroplating system such as described in U.S. Pat. No. 6,121,149, the entire contents of which are incorporated herein by reference. Examples of suitable electroplating tools are wafer plating cells manufactured by Technic, Inc. Besides electroplating, Cu or other via materials can be deposited in the invention using metal organic chemical vapor deposition (MOCVD) carriers such as for example using hexafluoroacetylacetonate copper vinyltrimethylsilane at a deposition temperature of 180° C. or higher.

The process methods, approaches, and systems described above are applicable to a number of 3D integration technologies.

Numerous modifications and variations on the present invention are possible in light of the above teachings. It is, therefore, to be understood that within the scope of the accompanying claims, the invention may be practiced otherwise than as specifically described herein.

The invention claimed is:

1. A method for forming an electronic package including first and second substrates, comprising:
    forming through-holes extending through an entire thickness of the first substrate;
    depositing and patterning an adherable substance on the second substrate in a pattern having openings which expose connections to an electronic device of the second substrate;
    prior to bonding of the first substrate and the second substrate together, partially curing the adherable substance to a state where the adherable substance is resistant to flow into the through-holes during a subsequent bonding of the first substrate and the second substrate together;
    aligning and attaching the first substrate and the second substrate together via the patterned adherable substance without reflow of the adherable substance into the through-holes; and
    forming metallizations in the through-holes to connect to said connections for the electronic device.

2. The method of claim 1, wherein aligning comprises aligning the through-holes with the exposed connections on the second substrate.

3. The method of claim 1, wherein forming through-holes comprises forming the through-holes in a pattern corresponding to said connections for the second electronic device.

4. The method of claim 3, wherein forming the through-holes in a pattern comprises:
    lithographic patterning and deep ion etching said pattern; or
    laser drilling said pattern.

5. The method of claim 1, wherein attaching comprises adhering the first substrate and the second substrate together with said adherable substance including at least one of an adhesive, an eutectic metal, or a silica based glass.

6. The method of claim 1, further comprising planarizing said adherable substance prior to said attaching the first substrate and the second substrate together.

7. The method of claim 1, wherein attaching comprises adhering the first substrate and the second substrate together with a patternable adhesive.

8. The method of claim 7, wherein attaching comprises adhering the first substrate and the second substrate together with a planarized, patternable adhesive.

9. The method of claim 1, wherein forming through-holes comprises forming the through-holes in a thinned glass or semiconductor substrate.

10. The method of claim 1, further comprising forming an insulating film on the walls of said through-holes to insulate a body of the first substrate from said metallizations in the through-holes.

11. A system for forming an electronic package, comprising:
   a wafer handler configured to handle a first substrate including through-holes and a second substrate;
   a through-hole formation unit configured to form said through-holes in a pattern corresponding to connections for an electronic device of the second substrate;
   a metallization unit configured to deposit said metallization into the through-holes to connect to components of the electronic device; and
   a wafer processor configured to 1) apply and pattern an adherable substance on the second substrate to produce a pattern in the adherable substance having openings which expose said connections to the second electronic device of the second substrate, 2) align the first and second substrates, and 3) attach the first substrate and the second substrate together.

* * * * *